(12) United States Patent
Pillonnet et al.

(10) Patent No.: US 10,593,485 B2
(45) Date of Patent: Mar. 17, 2020

(54) CAPACITIVE LOGIC CELL

(71) Applicant: Commissariat à l'Énergie Atomique et aux Énergies Alternatives, Paris (FR)

(72) Inventors: Gaël Pillonnet, Proveysieux (FR); Yann Perrin, Grenoble (FR); Ayrat Galisultanov, Grenoble (FR); Hervé Fanet, Revel (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/044,126

(22) Filed: Jul. 24, 2018

(65) Prior Publication Data

US 2019/0035559 A1  Jan. 31, 2019

(30) Foreign Application Priority Data

Jul. 25, 2017 (FR) ...................... 17 57060

(51) Int. Cl.
*H01G 5/16* (2006.01)
*H03K 19/00* (2006.01)
(Continued)

(52) U.S. Cl.
CPC ............... *H01G 5/16* (2013.01); *H01L 23/00* (2013.01); *H01L 23/49589* (2013.01);
(Continued)

(58) Field of Classification Search
CPC ..... H01L 23/00; H01L 23/642; H01L 23/645; H01L 23/647; H01L 23/66;
(Continued)

(56) References Cited

U.S. PATENT DOCUMENTS 6,242,989 B1   6/2001   Barber et al.
10,354,198 B1 *  7/2019   Filipp ...................... H03K 3/38
(Continued)

FOREIGN PATENT DOCUMENTS

JP   H09153436 A   6/1997

OTHER PUBLICATIONS

French Search Report dated Mar. 23, 2018 in connection with Application No. 1757060.
(Continued)

*Primary Examiner* — Arnold M Kinkead
(74) *Attorney, Agent, or Firm* — Wolf, Greenfield & Sacks, P.C.

(57) ABSTRACT

A logic cell including a fixed assembly including a first electrode, a mobile assembly including a second electrode, and third, fourth, and fifth electrodes, wherein: the first, second, third, fourth, and fifth electrodes are insulated from one another; the first and second electrodes define a capacitor variable according to the position of the mobile assembly relative to the fixed assembly; the third electrode is connected to a node of application of a first logic input signal; the fourth electrode is connected to a node of application of a second logic input signal; the fifth electrode is connected to a reference node; and the position of the second electrode relative to the first electrode is a function of a combination of the first and second logic input signals.

10 Claims, 6 Drawing Sheets

(51) Int. Cl.
| | |
|---|---|
| *H03K 19/185* | (2006.01) |
| *H03K 19/20* | (2006.01) |
| *H03K 19/02* | (2006.01) |
| *H01L 23/64* | (2006.01) |
| *H01L 23/00* | (2006.01) |
| *H01L 23/495* | (2006.01) |
| *H03K 4/94* | (2006.01) |
| *H01L 23/66* | (2006.01) |

(52) U.S. Cl.
CPC .......... *H01L 23/642* (2013.01); *H01L 23/645* (2013.01); *H01L 23/647* (2013.01); *H01L 23/66* (2013.01); *H03K 4/94* (2013.01); *H03K 19/0008* (2013.01); *H03K 19/0013* (2013.01); *H03K 19/02* (2013.01); *H03K 19/185* (2013.01); *H03K 19/20* (2013.01)

(58) Field of Classification Search
CPC .......... H01L 23/49589; H03K 19/0013; H03K 19/185; H03K 19/02; H03K 4/94; H03K 19/0008

USPC .................. 326/97, 98, 93; 334/78, 80, 81; 361/277, 211, 271
See application file for complete search history.

(56) References Cited

U.S. PATENT DOCUMENTS

| | | | |
|---|---|---|---|
| 2005/0253571 A1* | 11/2005 | Frank ...................... | H03K 4/94 324/76.11 |
| 2013/0021714 A1* | 1/2013 | Fanet ................ | H03K 19/0019 361/211 |
| 2017/0179954 A1 | 6/2017 | Fanet et al. | |

OTHER PUBLICATIONS

Yang et al., Electrostatic micro-actuator with a pre-charged series capacitor: modeling, design, and demonstration. Journal of Micromechanics & Microengineering, Institute of Physics Publishing, Bristol, GB, vol. 24, No. 6, May 6, 2014, p. 65012. 8 pages.

* cited by examiner

CAPACITIVE LOGIC CELL

This application claims the priority benefit of French patent application number 17/57060, the content of which is hereby incorporated by reference in its entirety to the maximum extent allowable by law.

BACKGROUND

The present disclosure concerns the field of logic cells made up of variable-capacitance capacitors.

DISCUSSION OF THE RELATED ART

European patent application No. 16204534 filed on Dec. 15, 2016 and the corresponding U.S. patent application Ser. No. 15/381,477 filed on Dec. 16, 2016, describe embodiments of logic cells made up of variable-capacitance capacitors with four electrodes.

FIG. 1 schematically illustrates a logic cell of the type described in the above-mentioned patent applications. The cell of FIG. 1 comprises two variable-capacitance capacitors C1 and C2. Each of capacitors C1 and C2 is a device with four electrodes d, s, g, and r electrically insulated from one another. Electrodes d and s, called main electrodes, are mobile with respect to each other. Electrodes g and r, called control electrodes, are intended to receive a control signal, for example, a voltage or a current, capable of varying the relative position of electrodes d and s to vary the value of capacitance Cds between electrodes d and s. The main electrodes d of capacitors C1 and C2 are connected to a same node sup of application of a power supply voltage PC of the cell. The main electrodes s of capacitors C1 and C2 are connected to a same node out supplying an output signal S of the cell. The control electrode g of capacitor C1 is connected to a node in1 of application of a logic input signal A of the cell, and the control electrode g of capacitor C2 is connected to a node in2 of application of a logic input signal B of the cell. The control electrodes r of capacitors C1 and C2 are connected to a same node GND of application of a reference potential of the cell, for example, the ground. In FIG. 1, a capacitor CL connected between output node out and reference node GND, schematically representing the output capacitance of the cell, has been shown. In the cell of FIG. 1, capacitors C1 and C2 are capacitors with a positive capacitance variation, that is, the capacitance of each capacitor between its main electrodes d and s takes a high value when the signal applied between its control electrodes g and r is at a high value, and takes a low value when the signal applied between its control electrodes g and r is at a low value.

The cell of FIG. 1 behaves as a capacitive voltage-dividing bridge comprising a controllable capacitance corresponding to equivalent capacitance $Ceq=C1+C2$ of the parallel association of capacitors C1 and C2, and a fixed capacitance formed by the capacitance CL of the output node out of the cell. The output voltage of the cell can be expressed as follows:

$$S = PC\frac{C_{eq}}{C_{eq} + C_L} = PC\frac{C1 + C2}{C1 + C2 + C_L}$$

When input signals A and B are in a low state, the capacitances of capacitors C1 and C2 take relatively low values C1low and C2low (for example, C1low=C2low) and output signal S is at a first voltage level. When input signals A and B are in a high state, the capacitances of capacitors C1 and C2 take relatively high values C1high and C2high (for example, C1high=C2high) and output signal S is at a second voltage level greater than the first level. When input signals A and B are in different states, for example, A=1 and B=0, the capacitances of capacitors C1 and C2 respectively take a low value and a high value, and output signal S is at a third voltage level between the first and second levels. Considering that the second and third voltage levels correspond to a high logic state of signal S, and that the first voltage level corresponds to a low logic state of signal S, the cell of FIG. 10 carries out a logic OR function (S=A+B).

More generally, the above-mentioned European patent application No. 16204534 and U.S. patent application Ser. No. 15/381,477 describe examples of cells capable of implementing various basic binary logic functions with two inputs and one output, and in particular the AND, NAND, and NOR logic functions, from two variable-capacitance capacitors with two electrodes.

It would be desirable to at least partly improve certain aspects of capacitive logic cells of the type described in the above-mentioned patent applications.

SUMMARY

Thus, an embodiment provides a capacitive logic cell comprising a fixed assembly comprising a first electrode, a mobile assembly comprising a second electrode, and third, fourth, and fifth electrodes, wherein:

the first, second, third, fourth, and fifth electrodes are electrically insulated from one another;

the first and second electrodes define a first variable capacitor according to the position of the mobile assembly relative to the fixed assembly;

the third electrode is connected to a node of application of a first logic input signal of the cell;

the fourth electrode is connected to a node of application of a second logic input signal of the cell;

the fifth electrode is connected to a node of application of a first reference potential of the cell; and the position of the second electrode with respect to the first electrode is a function of a combination of the first and second logic input signals.

According to an embodiment, the first and second logic input signals are referenced to said node of application of a first reference potential.

According to an embodiment, the cell further comprises a sixth electrode electrically insulated from the first, second, third, fourth, and fifth electrodes, the sixth electrode being connected to a node of application of the second reference potential, the first logic input signal being referenced to the node of application of a first reference potential and the second logic input signal being referenced to the node of application of the second reference potential.

According to an embodiment, the second electrode is connected to a node of application of a power supply voltage of the cell, and the first electrode is connected to a node supplying a first logic output signal of the cell.

According to an embodiment, the mobile assembly is mobile in translation with respect to the fixed assembly to vary the surface area of the second electrode opposite the first electrode without varying the distance between the first and second electrodes.

According to an embodiment, the mobile assembly is mobile in translation with respect to the fixed assembly to vary the distance between the first and second electrodes without varying the surface area of the second electrode opposite the first electrode.

According to an embodiment, the cell comprises a first electrostatic actuation device capable of causing a displacement of the mobile assembly with respect to the fixed assembly according to the state of the first logic input signal, and a second electrostatic actuation device capable of causing a displacement of the mobile assembly with respect to the fixed assembly according to the state of the second logic input signal.

According to an embodiment, the cell comprises an electrostatic actuation device capable of causing a displacement of the mobile assembly with respect to the fixed assembly according to the state of the first logic input signal, and an electrodynamic actuation device capable of causing a displacement of the mobile assembly relative to the fixed assembly according to the state of the second logic input signal.

According to an embodiment, the first electrode comprises first and second interconnected conductive portions, arranged on either side of the second electrode to limit the influence of the voltage between the first and second electrodes on the position of the mobile assembly relative to the fixed assembly.

According to an embodiment, the cell comprises a seventh electrode connected to a node of application of a third logic input signal of the cell, the position of the second electrode relative to the first electrode being a function of a combination of the first, second, and third logic input signals.

According to an embodiment, the fixed assembly comprises an eighth electrode electrically insulated from the first electrode, the eighth and second electrodes defining a second variable capacitor according to the position of the mobile assembly relative to the fixed assembly.

According to an embodiment, the eighth electrode is connected to a node supplying a second logic output signal of the cell.

The foregoing and other features and advantages will be discussed in detail in the following non-limiting description of specific embodiments in connection with the accompanying drawings.

DETAILED DESCRIPTION

Figure 1:
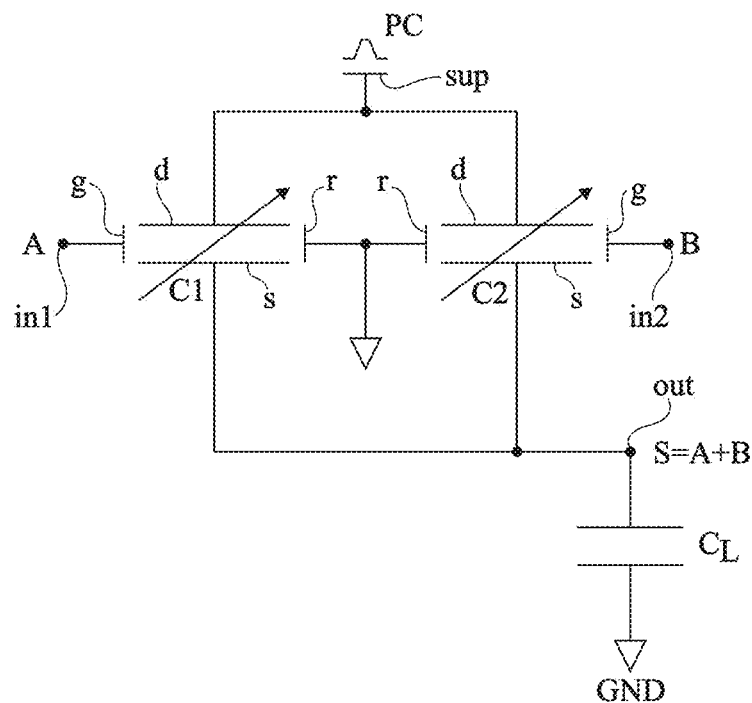
FIG. 1, previously described, is an electric diagram of an example of a capacitive logic cell.

The same elements have been designated with the same reference numerals in the different drawings and, further, the various drawings are not to scale. In the present description, term "connected" is used to designate a direct electric connection, with no intermediate electronic component, for example, by means of one or a plurality of conductive tracks, and term "coupled" or term "linked" is used to designate a connection which may be direct (then meaning "connected") or which may be performed via one or a plurality of components. In the following description, when reference is made to orientation qualifiers, such as terms "horizontal", "vertical", etc., reference is made to the orientation of the drawings, it being understood that, in practice, the described devices may be oriented differently. The terms "approximately", "substantially", and "in the order of" are used herein to designate a tolerance of plus or minus 10%, preferably of plus or minus 5%, of the value in question, or when they relate to angle values or to orientations, a tolerance of plus or minus 10°, preferably of plus or minus 5°. In the present disclosure, conductive plate designates a plate of a material capable of conducting electric charges, where this material may be a conductive material, for example, a metal, or also a semiconductor material, for example, silicon.

Unlike conventional logic cells made up of transistors, where the set of operations uses purely electrical effects (electric field effect combined with semiconductor junctions), the capacitive logic cells described in above-mentioned European patent application No. 16204534 and U.S. patent application Ser. No. 15/381,477 (the content of which is herein incorporated by reference as authorized by law) mechanically code logic states (via a relative position between the main electrodes of each capacitor). Such a mechanical coding enables to do away with the usual power tradeoff between conductive dissipation and leakage dissipation, inherent to all logic cells made up of transistors. As a counterpart, electromechanical transduction creates losses for each change of logic state.

According to an aspect of an embodiment, to decrease the number of components and the number of electromechanical transductions necessary to implement a logic operation, a logic cell based on a single variable-capacitance capacitor with five electrodes is provided instead of two variable-capacitance capacitors with four electrodes in the above-mentioned European and US patent applications.

Figure 2:
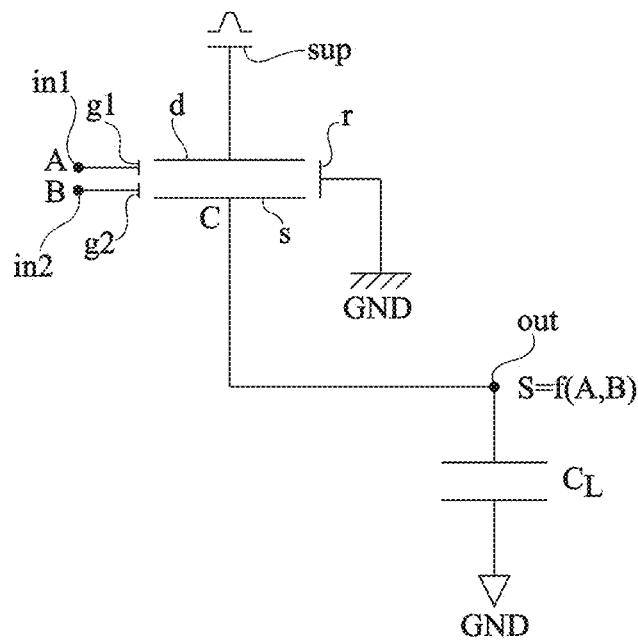
FIG. 2 is an electric diagram of an embodiment of a capacitive logic cell.

FIG. 2 is an electric diagram of an embodiment of a capacitive logic cell. The cell of FIG. 2 comprises a variable-capacitance capacitor C. Capacitor C is a device with five electrodes d, s, g1, g2, and r electrically insulated from one another. Electrodes d and s, called main electrodes, are mobile with respect to each other. Electrodes g1, g2, and r, called control electrodes, are intended to receive control signals, for example, voltages or currents, capable of varying the relative position of electrodes d and s to vary the value of capacitance Cds between electrodes d and s. More particularly, in this example, a first control signal may be applied between electrodes g1 and r and a second control signal may be applied between electrodes g2 and r, the relative position of electrodes d and s, and thus capacitance Cds of capacitor C, being a function of a combination of the first and second control signals.

Main electrode d of capacitor C is connected to a node sup of application of a power supply voltage PC of the cell, for example, a DC voltage (in the case of an implementation of a static logic circuit where the states of the logic signals are available at any time) or, preferably, a periodic variable voltage (in the case of an implementation of a dynamic logic circuit where the states of the logic signals are only available during part of the period of a periodic clock signal, as described in above-mentioned European patent application No. 16204534 and U.S. patent application Ser. No. 15/381, 477), for example, a trapezoidal voltage. Main electrode s of capacitor C is connected to a node out supplying an output logic state S of the cell. Control electrode g1 of capacitor C is connected to a node in1 of application of a logic input signal A of the cell, and control electrode g2 of capacitor C is connected to a node in2 of application of a logic input signal B of the cell. The control electrode r of capacitor C is connected to a node GND of application of a reference potential of the cell, for example, the ground. In FIG. 2, a capacitor CL connected between output node out and reference node GND has further been shown, schematically representing the output capacitor of the cell. In practice, it is possible for output capacitor CL to comprise no component specifically formed and connected to output node out, but to correspond to the sum of the capacitances of the different elements connected to node out, particularly interconnection tracks, or also to another capacitive logic cell (not shown) having its input which may be connected to node out. In this example, input signals A and B, output signal S, and power supply signal PC of the cell are referenced to node GND.

The cell of FIG. 2 behaves as a capacitive voltage-dividing bridge comprising a controllable capacitance corresponding to capacitance Cds of capacitor C and a fixed capacitance formed by capacitor CL of output node out of the cell. The output voltage of the cell can be expressed as follows:

$$S = PC \frac{Cds}{Cds + C_L}$$

Capacitance Cds of capacitor C being a function of a combination of logic input signals A and B, the cell carries out a logic operation S=f(A,B) by means of a single variable-capacitance capacitor with five electrodes.

The logic function carried out by the cell depends on the layout of variable-capacitance capacitor C. Various embodiments of variable-capacitance capacitor C, capable of implementing various basic logic functions, will now be described.

Figure 3:
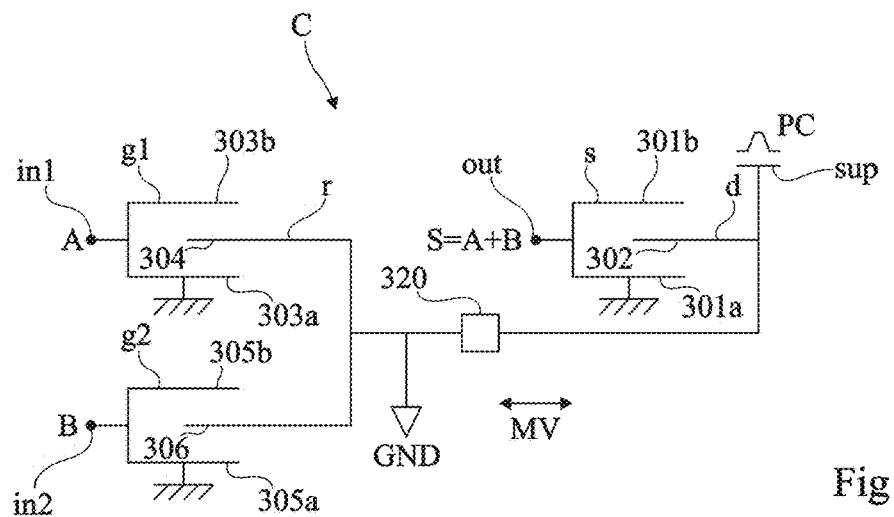
FIG. 3 is a simplified cross-section view of an example of a variable-capacitance capacitor of a capacitive logic cell according to an embodiment.

FIG. 3 is a simplified cross-section view of an embodiment of the variable-capacitance capacitor C of the cell of FIG. 2, capable of implementing a logic OR operation.

Capacitor C comprises two assemblies mobile with respect to each other, hereafter respectively called fixed assembly and mobile assembly. All the elements of the fixed assembly are fixed with respect to one another, and all the elements of the mobile assembly are fixed with respect to one another. FIG. 3 and the following drawings show with oblique hatchings a mechanical mass having all the elements of the fixed assembly attached thereto.

In the example of FIG. 3, electrodes s, g1, and g2 belong to the fixed assembly, and electrodes d and r belong to the mobile assembly. The square bearing reference numeral 320 in FIG. 3 schematizes an electrically-insulating region separating electrodes d and r of the mobile assembly.

Electrode s comprises two substantially horizontal conductive plates 301a and 301b facing each other (that is, substantially cofounded in vertical projection), electrically connected to output node out of the cell. Electrode g1 comprises two substantially horizontal conductive plates 303a and 303b facing each other, electrically connected to input node in1 of the cell. Electrode g2 comprises two substantially horizontal conductive plates 305a and 305b facing each other, electrically connected to input node in2 of the cell. Electrode d comprises a substantially horizontal conductive plate 302, electrically connected to power supply node sup of the cell. Electrode r comprises two substantially horizontal conductive plates 304 and 306 electrically connected to reference node GND of the cell.

The fixed assembly and the mobile assembly are arranged so that conductive plates 302, 304, and 306 are respectively arranged:

between conductive plates 301a and 301b, at least partially opposite conductive plates 301a and 301b, substantially at an equal distance from conductive plates 301a and 301b;

between conductive plates 303a and 303b, at least partially opposite conductive plates 303a and 303b, substantially at an equal distance from conductive plates 303a and 303b; and between conductive plates 305a and 305b, at least partially opposite conductive plates 305a and 305b, substantially at an equal distance from conductive plates 305a and 305b.

In this example, the mobile assembly is free to displace according to a single degree of liberty in horizontal translation (parallel to conductive plates 301a, 301b, 302, 303a, 303b, 304, 305a, 305b, 306) with respect to the fixed assembly, to modify the surface area of mobile conductive plate 302, respectively 304, respectively 306 opposite the corresponding fixed conductive plates 301a and 301b, respectively 303a and 303b, respectively 305a and 305b, without modifying the distance between each mobile conductive plate and the corresponding fixed conductive plates (motion represented by a double arrow MV in the drawing). More particularly, in the example of FIG. 3, the fixed assembly and the mobile assembly are arranged so that when the surface area of any of mobile conductive plates 302, 304, and 306 opposite the corresponding fixed conductive plates 301a and 301b, respectively 303a and 303b, respectively 305a and 305b increases, the surface area of the other mobile conductive plates opposite the corresponding fixed conductive plates increases, and conversely.

The capacitor C of FIG. 3 further comprises pull back means (not shown in the drawings), for example, a return spring, arranged to, in the absence of any electric biasing of electrodes g1, g2, s, and d with respect to electrode r, take the mobile assembly back to a so-called idle position (with respect to the fixed assembly), where mobile conductive plates 302, 304, and 306 only partially face the corresponding fixed conductive plates 301a and 301b, respectively 303a and 303b, respectively 305a and 305b (for example, the position shown in FIG. 3).

At the first order, capacitance Cds of capacitor C between its main electrodes s and d is proportional to the surface area of conductive plate 302 opposite conductive plates 301a and 301b.

In the example of FIG. 3, logic input signals A and B and output signal S are voltages.

When input signals A and B are in a low state, that is, at a voltage level lower (in absolute value) than a threshold VinL, for example, at a substantially zero voltage, capacitor C is in its idle position, and capacitance Cds of capacitor C has a first value. Output signal S of the cell thus has a first voltage level Vout1.

When one of input signals A and B is in a high state, that is, at a voltage higher (in absolute value) than a threshold VinH greater than or equal to threshold VinL, mobile conductive plate 304 (if A=1 and B=0) or 306 (if A=0 and B=1) is attracted between the corresponding fixed conductive plates 303a and 303b or 305a and 305b, by electrostatic interaction. This causes a horizontal displacement of the mobile assembly with respect to the fixed assembly, tending to increase the surface area of mobile conductive plate 304 or 306 opposite the corresponding fixed conductive plates 303a and 303b or 305a and 305b and, accordingly, the surface area of mobile conductive plate 302 opposite fixed conductive plates 301a and 301b. Capacitance Cds of capacitor C thus takes a second value greater than the first value. Output signal S of the cell then has a second voltage level Vout2 greater (in absolute value) than the first level.

When the two input signals A and B are in the high state, the electrostatic force exerted by conductive plates 303a and 303b on conductive plate 304 and the electrostatic force exerted by conductive plates 305a and 305b on conductive plate 306 add to each other. The horizontal displacement of the mobile assembly with respect to the fixed assembly is thus amplified. Capacitance Cds of capacitor C then takes a third value greater than the second value, and output signal S of the cell has a third voltage level Vout3 higher (in absolute value) than the second level.

Considering that second and third voltage levels Vout2 and Vout3 correspond to a high logic state of signal S, and that first voltage level Vout1 corresponds to a low logic state of signal S, capacitor C of FIG. 3 effectively carries out an OR function (S=A+B).

As an example, capacitor C is sized so that the high logic state of output signal S is interpreted as a high logic state when it is applied to input in1 or in2 of the cell, and so that the low logic state of output signal S is interpreted as a low logic state when it is applied to input in1 or in2 of the cell. This enables to directly cascade a plurality of identical or similar capacitive logic cells, without requiring level matching circuits at the interface between the different cells. As an example, capacitor C of FIG. 3 is sized so that output voltage levels Vout2 and Vout3 are higher than threshold VinH, and so that output voltage level Vout1 is lower than threshold VinL.

Figure 4:
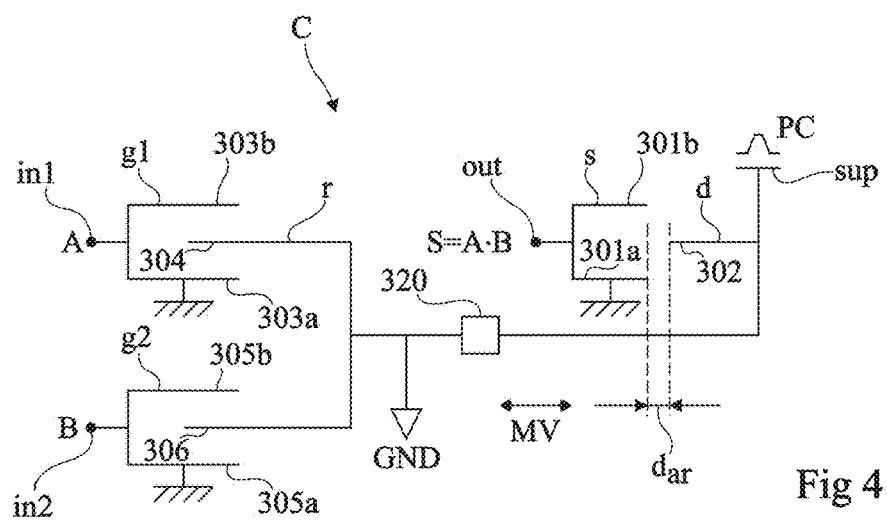
FIG. 4 is a simplified cross-section view of another example of a variable-capacitance capacitor of a capacitive logic cell according to an embodiment.

FIG. 4 is a simplified cross-section view of another embodiment of variable-capacitance capacitor C of the cell of FIG. 2, capable of implementing a logic AND operation.

The capacitor C of FIG. 4 differs from the capacitor C of FIG. 3 mainly in that, in the example of FIG. 4, in the idle position of the capacitor, conductive plates 302 on the one hand, and 301a and 31b on the other hand, do not overlap. In other words, in the idle position, conductive plate 302 does not face conductive plates 301a and 301b. More particularly, in the idle position, in vertical projection, a non-overlap distance dar separates conductive plate 302 from conductive plates 301a and 301b.

For the rest, the capacitor C of FIG. 4 is identical or similar to the capacitor C of FIG. 3.

When input signals A and B are in the low state, due to the non-overlapping of mobile conductive plate 302 and of the corresponding fixed conductive plates 301a and 301b, capacitance Cds of the capacitor is zero or negligible. Output signal S of the cell thus has a zero or negligible voltage level, corresponding to a low logic state of signal S.

When only one of signals A and B is in the high state, the corresponding mobile conductive plate 304 or 306 is attracted between the corresponding fixed conductive plates 303a and 303b or 305a and 305b, by electrostatic interaction. This causes a horizontal displacement of the mobile assembly with respect to the fixed assembly, tending to decrease the non-overlap distance dar between conductive plate 302 and conductive plates 301a and 301b, without however taking it down to zero. Thus, capacitance Cds of the capacitor remains zero or negligible, and output signal S of the cell remains in the low state.

When input signals A and B are both in the high state, the horizontal displacement of the mobile assembly with respect to the fixed assembly is amplified, and conductive plate 302 penetrates between conductive plates 301a and 301b. Capacitance Cds of capacitor C then takes a non-negligible value, and output signal S of the cell takes a non-negligible voltage level, corresponding to a high logic state of signal S.

Thus, capacitor C of FIG. 4 effectively carries out an AND function (S=A.B).

Figure 5:
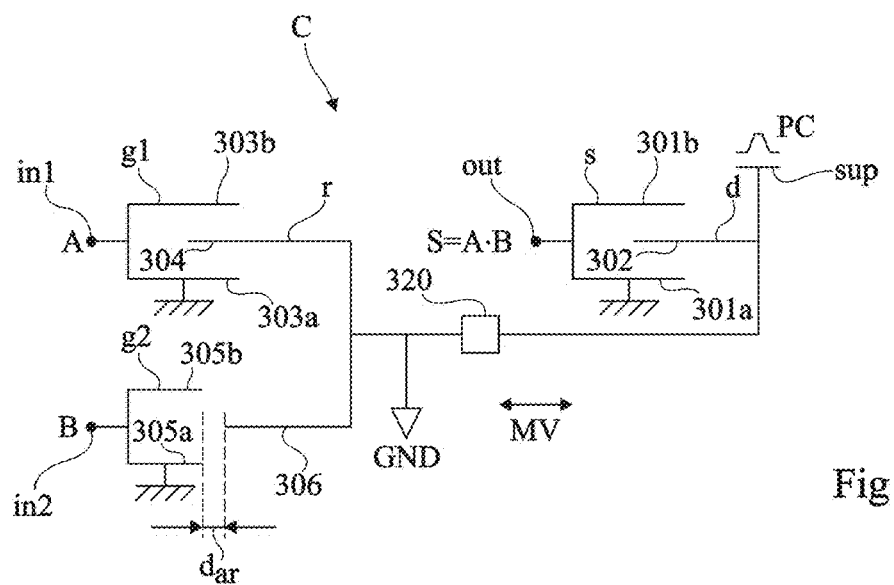
FIG. 5 is a simplified cross-section view of another example of a variable-capacitance capacitor of a capacitive logic cell according to an embodiment.

FIG. 5 is a simplified cross-section view of another embodiment of variable-capacitance capacitor C of the cell of FIG. 2, capable of implementing a logic AND operation.

The capacitor C of FIG. 5 differs from the capacitor C of FIG. 3 mainly in that, in the example of FIG. 5, in the idle position of the capacitor, conductive plates 306 on the one hand, and 305a and 305b on the other hand, do not overlap. In other words, in the idle position, conductive plate 306 does not face conductive plates 305a and 305b. More particularly, in the idle position, in vertical projection, a non-overlap distance dar separates conductive plate 306 from conductive plates 305a and 305b.

For the rest, capacitor C of FIG. 5 is identical or similar to capacitor C of FIG. 3.

When signal A is in the low state, capacitor C remains in its idle position independently from the state of signal B. In particular, if signal B is in the high state, the electrostatic force exerted on conductive plate 306 by conductive plates 305a and 305b is negligible due to the non-overlapping of electrodes 306 and 305a, 305b. Capacitance Cds of capacitor C then has a first value, and output signal S of the cell has a first voltage level corresponding to a low logic state of signal S.

When signal A is in the high state, the electrostatic force exerted on mobile conductive plate 304 by fixed conductive plates 303a and 303b causes a horizontal displacement of the mobile assembly with respect to the fixed assembly, tending to increase the surface area of conductive plate 304 opposite conductive plates 303a and 303b. This leads to increasing the surface area of conductive plate 302 opposite conductive plates 301a and 301b and to making conductive plate 306 penetrate between conductive plates 305a and 305b. If signal B is in the low state, capacitance Cds of capacitor C then has a second value greater than the first value, and output signal S of the cell has a second voltage level greater (in absolute value) than the first level, still corresponding to the low logic state of signal S. If, however, signal B is in the high state, the electrostatic force exerted on conductive plate 306 by conductive plates 305a and 305b tends to amplify the horizontal displacement of the mobile assembly with respect to the fixed assembly, leading to increasing the surface area of conductive plate 302 opposite conductive plates 301a and 301b. Capacitance Cds of capacitor C then has a third value greater than the second value, and output signal S of the cell has a third voltage level greater (in absolute value) than the second level, corresponding to the high logic state of signal S.

Thus, capacitor C of FIG. 5 effectively carries out an AND function (S=A.B).

Figure 6:
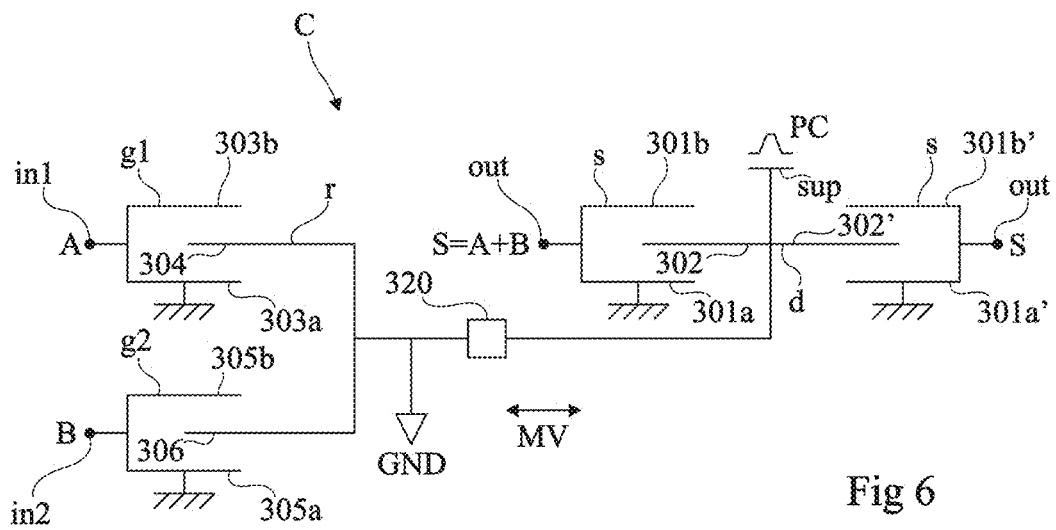
FIG. 6 is a simplified cross-section view of another example of a variable-capacitance capacitor of a capacitive logic cell according to an embodiment.

FIG. 6 is a simplified cross-section view of another embodiment of variable-capacitance capacitor C of the cell of FIG. 2, capable of implementing a logic OR operation.

The capacitor C of FIG. 6 comprises the same elements as the capacitor C of FIG. 5, arranged substantially in the same way.

In the example of FIG. 6, electrode d of the capacitor comprises an additional substantially horizontal conductive plate 302', fixed with respect to conductive plate 302 and electrically connected to conductive plate 302.

Further, in this example, electrode s of the capacitor comprises two additional substantially horizontal plates 301a' and 301b' facing each other, fixed with respect to conductive plates 301a and 301b, and electrically connected to conductive plates 301a and 301b.

The fixed assembly and the mobile assembly are arranged so that conductive plate 302' is arranged between conductive plates 301a' and 301b', at least partially opposite conductive plates 301a' and 301b', substantially at an equal distance from conductive plates 301a' and 301b'.

More particularly, in the example of FIG. 6, the fixed assembly and the mobile assembly are arranged so that when the surface area of conductive plate 302 opposite conductive plates 301a and 301b increases, the surface area of conductive plate 302' opposite conductive plates 301a' and 301b' decreases, and conversely.

As a result, when a non-zero voltage is applied between electrodes d and s of the capacitor, the electrostatic force exerted by conductive plates 301a' and 301b' on conductive plate 302' opposes the electrostatic force exerted by conductive plates 301a and 301b on conductive plate 302. This enables to limit the influence of voltage Uds between electrodes d and s of the capacitor on the value of capacitance Cds, or even to suppress the influence of voltage Uds on capacitance Cds when the surface area of conductive plate 302 opposite conductive plates 301a and 301b is equal to the surface area of conductive plate 302' opposite conductive plates 301a' and 301b' (configuration shown in FIG. 6, for example corresponding to the idle position of the capacitor).

It should be noted that, in the present example, to allow a variation of the capacitance between main electrodes d and s of the device, the lateral displacement should be sufficient for plate 302' to no longer be opposite plates 301a', 301b', so that the decrease in the capacitance between plates 302' and 301a', 301b' is no longer compensated for by the capacitance increase between plates 302 and 301a, 301b. In other words, the displacement due to the application of input signals A and B should be greater than the initial overlapping between plates 302' and 301a', 301b'.

Figure 7:
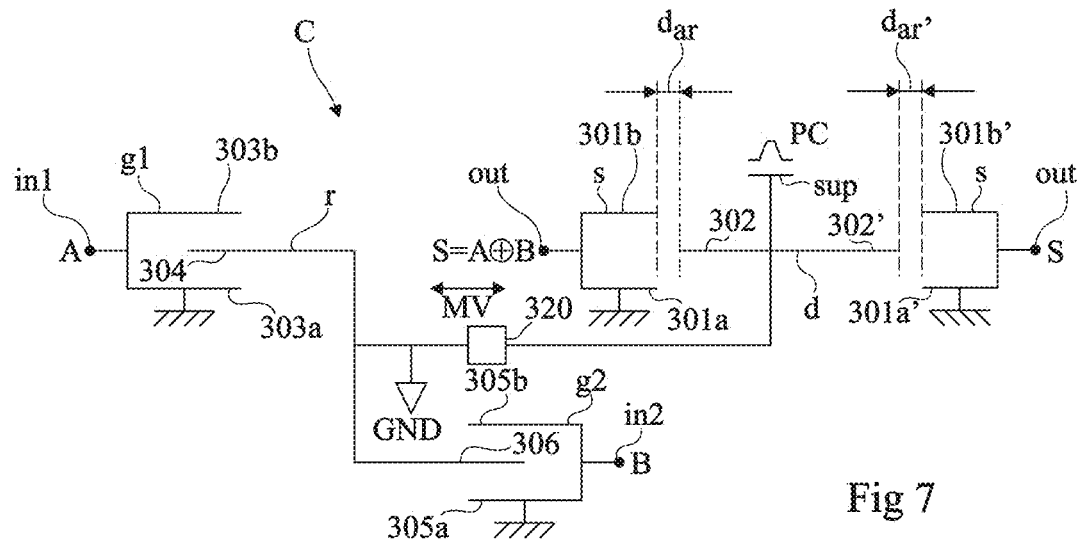
FIG. 7 is a simplified cross-section view of another example of a variable-capacitance capacitor of a capacitive logic cell according to an embodiment.

FIG. 7 is a simplified cross-section view of another embodiment of the variable-capacitance capacitor C of the cell of FIG. 2, capable of implementing a logic XOR operation.

The capacitor C of FIG. 7 comprises elements common with the capacitor C of FIG. 6. Only the differences between the two capacitors will be detailed hereafter.

The capacitor C of FIG. 7 differs from the capacitor C of FIG. 6 in that, in the example of FIG. 7, in the idle position of the capacitor, conductive plates 302 on the one hand, and 301a and 301b on the other hand, do not overlap. Further, in the idle position of the capacitor, conductive plates 302' on the one hand and 301a' and 301b' on the other hand do not overlap. More particularly, in the idle position, in vertical projection, a non-overlap distance dar separates conductive plate 302 from conductive plates 301a and 301b, and a non-overlap distance dar', for example, substantially identical, separates conductive plate 302' from conductive plates 301a' and 301b'.

Another difference between the capacitor C of FIG. 7 and the capacitor C of FIG. 6 is that, in the example of FIG. 7, the fixed assembly and the mobile assembly are arranged so that when the surface area of mobile conductive plate 304 opposite fixed conductive plates 303a and 303b increases:

non-overlap distance dar between conductive plate 302 and conductive plates 301a and 301b decreases, or the surface area of conductive plate 302 opposite conductive plates 301a and 301b increases;

non-overlap distance dar' between conductive plate 302' and conductive plates 301a' and 301b' increases, or the surface area of conductive plate 302' opposite conductive plates 301a' and 301b' decreases; and the surface area of conductive plate 306 opposite conductive plates 305a and 305b decreases, and conversely.

When input signals A and B are in a low state, capacitor C is in its idle position. Due to the non-overlapping between conductive plate 302 and conductive plates 301a, 301b on the one hand, and between conductive plates 302' and conductive plates 301a' and 301b' on the other hand, capacitance Cds of capacitor C is zero or negligible. Output signal S of the cell thus has a zero or negligible voltage level, corresponding to a low logic state of signal S.

When the two input signals A and B are in the high state, the electrostatic force exerted by conductive plates 303a and 303b on conductive plate 304 compensates for the electrostatic force exerted by conductive plates 305a and 305b on conductive plate 306, so that capacitor C remains in its idle position. Output signal S of the cell thus remains at the low state of signal S.

When input signals A and B are respectively in a high state and in a low state, the electrostatic force exerted by conductive plates 303a and 303b on conductive plate 304 causes a horizontal displacement of the mobile assembly with respect to the fixed assembly, tending to increase the surface area of conductive plate 304 opposite conductive plates 303a and 303b. As a result, conductive plate 302 penetrates between conductive plates 301a and 301b. Capacitance Cds of capacitor C then takes a non-negligible value, and output signal S of the cell takes a non-negligible voltage level, corresponding to a high logic state of signal S.

Similarly, when input signals A and B are respectively in a low state and in a high state, the electrostatic force exerted by conductive plates 305a and 305b on conductive plate 306 causes a horizontal displacement of the mobile assembly with respect to the fixed assembly, tending to increase the surface area of conductive plate 306 opposite conductive plates 305a and 305b. As a result, conductive plate 302' penetrates between conductive plates 301a' and 301b'. Capacitance Cds of capacitor C then takes a non-negligible value, and output signal S of the cell takes a non-negligible voltage level, corresponding to a high logic state of signal S.

Thus, capacitor C of FIG. 7 effectively carries out an XOR function (S=A⊕B).

Figure 8:
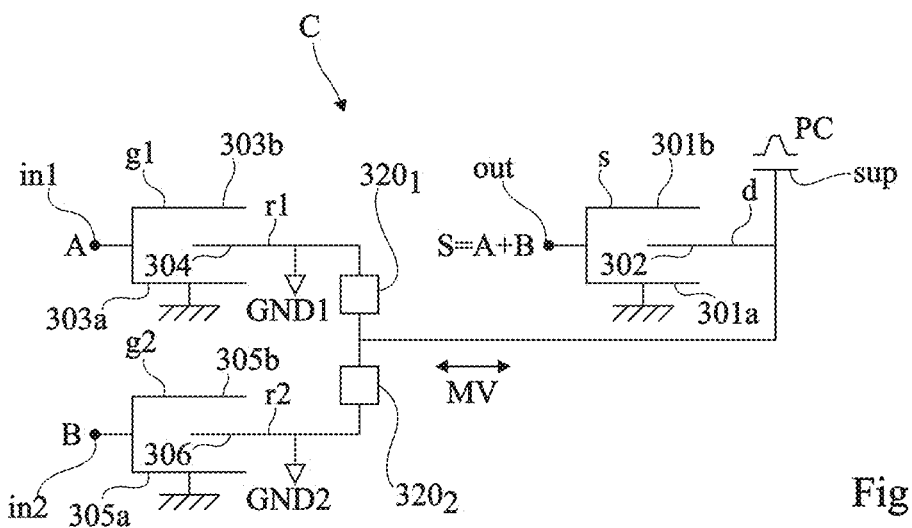
FIG. 8 is a simplified cross-section view of another example of a variable-capacitance capacitor of a capacitive logic cell according to an embodiment.

FIG. 8 is a simplified cross-section view of another embodiment of a variable-capacitance capacitor C capable of implementing a logic OR operation.

The capacitor of FIG. 8 differs from the previous examples in that it comprises six electrodes electrically insulated from one another, instead of five in the previous examples. More particularly, in the capacitor of FIG. 8, electrode r is replaced with two electrodes r1 and r2 electrically insulated from each other, each of electrodes r1 and r2 being electrically insulated from electrodes d, s, g1, and g2. The electrodes of capacitor C of FIG. 8 are for example connected similarly or identically to what has been previously described, with the difference that electrode r1 and electrode r2 are connected to nodes GND1 and GND2 of application of different reference potentials. A first control signal may be applied between electrodes g1 and r1 and a second control signal may be applied between electrodes g2 and r2, the relative position of electrodes d and s, and thus capacitance Cds of capacitor C, being a function of a combination of the first and second control signals. In this example, electrodes r1 and r2 form part of the mobile assembly of capacitor C. In FIG. 8, the square bearing reference numeral 3201 schematizes an electrically-insulating region separating electrode r1 from electrodes d and r2 of the mobile assembly, and the square bearing reference numeral 3202 schematizes an electrically-insulating region separating electrode r2 from electrodes d and r1.

The capacitor C of FIG. 8 comprises the same elements as the capacitor C of FIG. 3, arranged substantially in the same way, and differs from the capacitor C of FIG. 3 essentially in that, in the example of FIG. 8, conductive plates 304 and 306 are electrically insulated from each other. Conductive plate 304 is connected to node GND1 and forms electrode r1 of the capacitor, and conductive plate 306 is connected to node GND2 and forms electrode r2 of the capacitor.

An advantage of the capacitor C of FIG. 8 is that it enables to carry out a logic operation bearing on signals referenced to different potentials.

Figure 9:
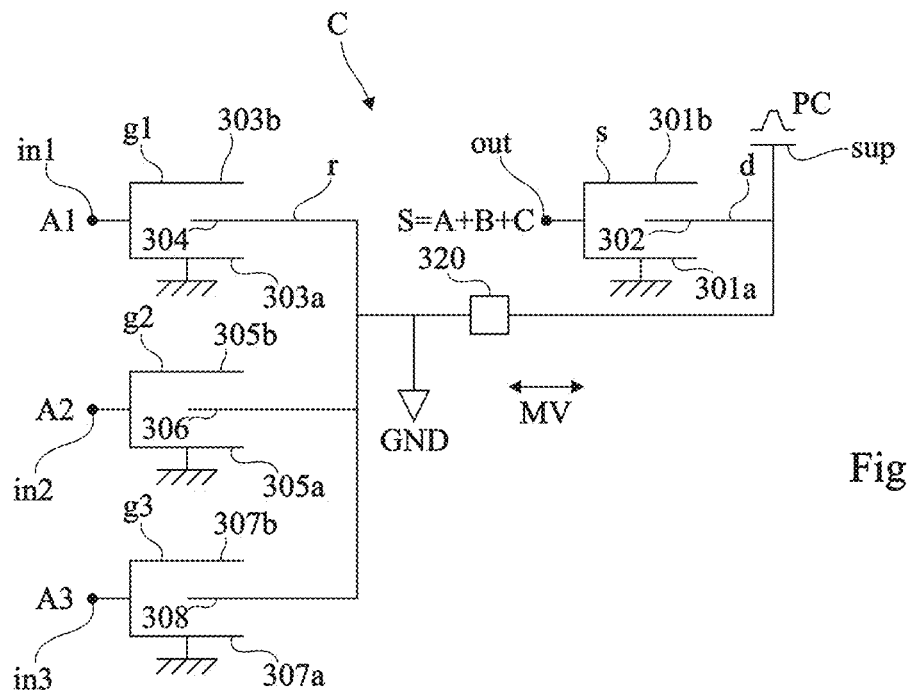
FIG. 9 is a simplified cross-section view of another example of a variable-capacitance capacitor of a capacitive logic cell according to an embodiment.

FIG. 9 is a simplified cross-section view of another embodiment of a variable-capacitance capacitor C capable of implementing a logic OR operation. Unlike the previously-described examples where capacitor C enables to perform logic operations with two inputs and one output, the capacitor C of FIG. 9 enables to perform a logic operation with three inputs and one output.

The capacitor C of FIG. 9 comprises the same elements as the capacitor C of FIG. 3, arranged substantially in the same way. The capacitor C of FIG. 9 further comprises an additional control electrode g3, electrically insulated from electrodes d, s, g1, g2, and r. In this example, electrode g3 forms part of the fixed assembly of the capacitor.

In the example of FIG. 9, electrode g3 comprises two substantially horizontal conductive plates 307a and 307b facing each other, electrically connected to a third input node in3 of the cell.

Further, in this example, electrode r comprises an additional substantially horizontal conductive plate 308, electrically connected to reference node GND of the cell.

The fixed assembly and the mobile assembly are arranged so that conductive plate 308 is arranged between conductive plates 307a and 307b, at least partially opposite conductive plates 307a and 307b, substantially at an equal distance from conductive plates 307a and 307b. More particularly, in the example of FIG. 9, the fixed assembly and the mobile assembly are arranged so that when the surface area of conductive plate 308 opposite conductive plates 307a and 307b increases, the surface area of conductive plate 302 opposite conductive plates 301a and 301b increases, and conversely.

In this example, nodes in1, in2, and in3 of capacitor C are intended to respectively receive logic input signals A1, A2, and A3.

When input signals A1, A2, and A3 are in the low state, capacitor C is in its idle position, and capacitance Cds of capacitor C has a first value. Output signal S of the cell thus has a first voltage level Vout1.

When one of input signals A1, A2, and A3 is in the high state, a horizontal displacement of the mobile assembly with respect to the fixed assembly occurs, tending to increase the surface area of conductive plate 302 opposite conductive plates 301a and 301b. Capacitance Cds of capacitor C thus takes a second value greater than the first value, and output signal S of the cell takes a second voltage level Vout2 greater (in absolute value) than the first level.

When two of input signals A1, A2, and A3 are in the high state, the horizontal displacement of the mobile assembly with respect to the fixed assembly is amplified, and capacitance Cds of capacitor C takes a third value greater than the second value. Output signal S of the cell then takes a third voltage level Vout3 greater (in absolute value) than the second level.

When input signals A1, A2, and A3 are all three in the high state, the horizontal displacement of the mobile assembly with respect to the fixed assembly is amplified again, and capacitance Cds of capacitor C takes a fourth value greater than the third value. Output signal S of the cell then takes a fourth voltage level Vout4 greater (in absolute value) than the third level.

Considering that the second, third, and fourth voltage levels Vout2, Vout3, and Vout4 correspond to a high logic state of signal S, and that the first voltage level Vout1 corresponds to a low logic state of signal S, capacitor C of FIG. 3 effectively carries out an OR function (S=A1+A2+A3).

More generally, it will be within the abilities of those skilled in the art to adapt the described examples to carry out logic functions with N inputs and one output, where N is any integer greater than or equal to 2.

Figure 10:
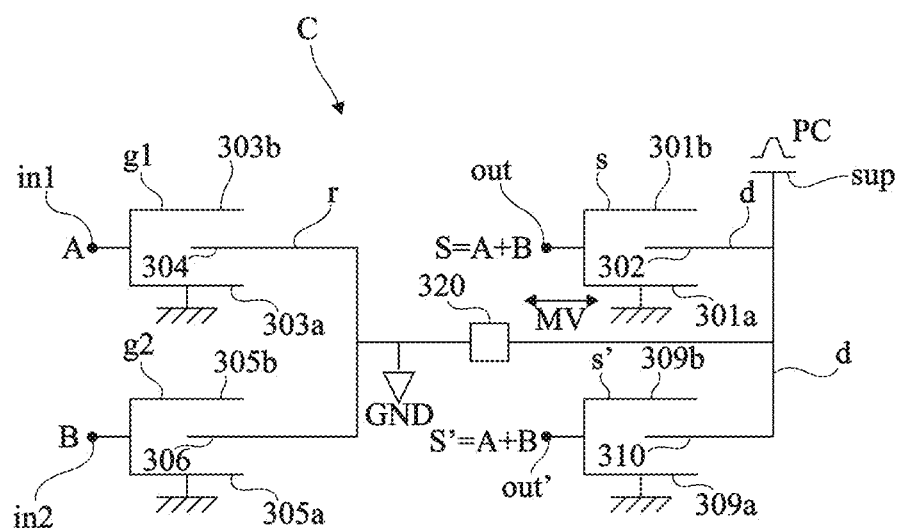
FIG. 10 is a simplified cross-section view of another example of a variable-capacitance capacitor of a capacitive logic cell according to an embodiment.

FIG. 10 is a simplified cross-section view of another embodiment of a variable-capacitance capacitor C capable of implementing a logic OR operation. Unlike the previously-described examples where capacitor C enables to carry out logic operations with N inputs and one output, the capacitor C of FIG. 9 enables to carry out a logic operation with N inputs and two outputs.

The capacitor C of FIG. 10 comprises the same elements as the capacitor C of FIG. 3, arranged substantially in the same way. The capacitor C of FIG. 10 further comprises an additional main electrode s', electrically insulated from electrodes s, d, g1, g2, and r. In this example, electrode s' forms part of the fixed assembly of the capacitor.

In the example of FIG. 10, electrode s' comprises two additional substantially horizontal conductive plates 309a and 309b facing each other, electrically connected to a second output node out' of the cell.

Further, in this example, electrode d comprises a substantially horizontal additional conductive plate 310, electrically connected to power supply node sup of the cell.

The fixed assembly and the mobile assembly are arranged so that conductive plate 310 is arranged between conductive plates 309a and 309b, at least partially opposite conductive plates 309a and 309b, substantially at an equal distance from conductive plates 309a and 309b. More particularly, in the example of FIG. 10, the fixed assembly and the mobile assembly are arranged so that when the surface area of conductive plate 302 opposite conductive plates 301a and 301b increases, the surface area of conductive plate 310 opposite conductive plates 309a and 309b decreases, and conversely.

Nodes out and out' are intended to respectively supply logic output signals S and S'.

In this example, capacitance Cds' of the capacitor between electrodes d and s' substantially varies in the same way as capacitance Cds of the capacitor between electrodes d and s.

Thus, the logic output signal S' supplied on output node out' is an image of the logic output signal S supplied on output node out.

An advantage of such a configuration is that it enables to supply the result of the logic combination of signals A and B on two different output nodes electrically insulated from each other.

More generally, it will be within the abilities of those skilled in the art to adapt the described examples to carry out logic functions with N inputs and M outputs, where M is any integer greater than or equal to 1.

Figure 11:
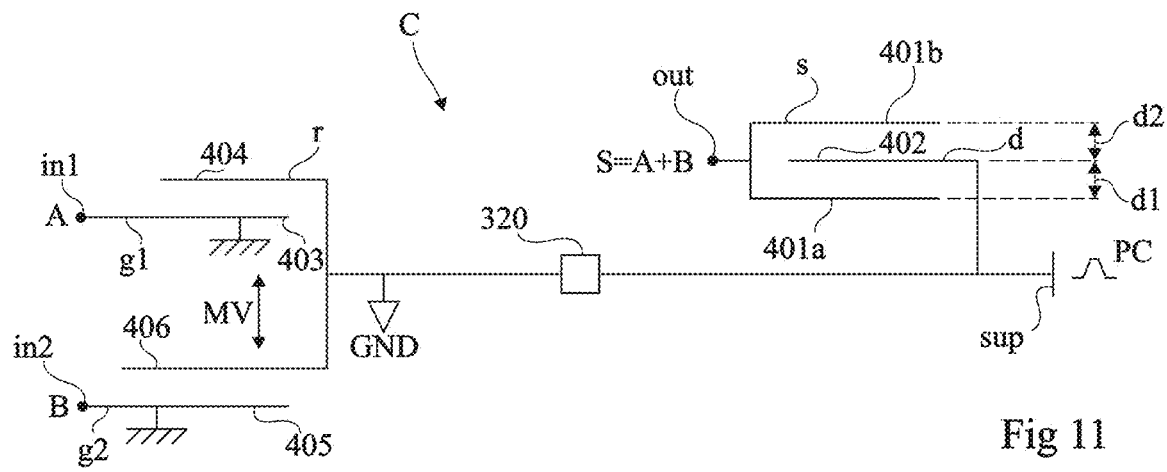
FIG. 11 is a simplified cross-section view of another example of a variable-capacitance capacitor of a capacitive logic cell according to an embodiment.

FIG. 11 is a simplified cross-section view of another embodiment of the variable-capacitance capacitor C of the cell of FIG. 2, capable of implementing a logic OR operation. The capacitor C of FIG. 11 comprises elements common with the capacitor C of FIG. 3. Only the differences between the two capacitors will be detailed hereafter.

In the example of FIG. 11, electrode s of the capacitor comprises two substantially horizontal conductive plates 401a and 401b facing each other, electrically connected to output node out of the cell. Electrode g1 of the capacitor comprises a substantially horizontal conductive plate 403, electrically connected to input node in1 of the cell. Electrode g2 of the capacitor comprises a substantially horizontal conductive plate 405, electrically connected to input node in2 of the cell. Electrode d of the capacitor comprises a substantially horizontal conductive plate 402, electrically connected to power supply node sup of the cell. Electrode r of the cell comprises two substantially horizontal conductive plates 404 and 406, electrically connected to reference node GND of the cell.

The fixed assembly and the mobile assembly are arranged so that conductive plate 402, 404, and 406 are respectively arranged:

between conductive plates 401a and 401b, at least partially opposite conductive plates 401a and 401b;

at least partially opposite conductive plate 403; and at least partially opposite conductive plate 405.

In this example, the mobile assembly is free to displace according to a single degree of liberty in vertical translation (orthogonally to conductive plates 401a, 401b, 402, 403, 404, 405, 406) with respect to the fixed assembly (motion represented by a double arrow MV in the drawing), to modify the distance between mobile conductive plate 402 and fixed conductive plates 401a and 401b, the distance between mobile conductive plate 404 and fixed conductive plate 403, and the distance between mobile conductive plate 406 and fixed conductive plate 405, without modifying the surface area of mobile conductive plate 402 opposite fixed conductive plates 401a and 401b, the surface area of mobile conductive plate 404 opposite fixed conductive plate 403, and the surface area of mobile conductive plate 406 opposite fixed conductive plate 405. More particularly, in the example of FIG. 11, the fixed assembly and the mobile assembly are arranged so that when the distance between any of mobile conductive plates 402, 404, and 406 and the corresponding fixed conductive plate 401a, respectively 403, respectively 405, increases, the distance between the other mobile conductive plates and the fixed conductive plates increases by the same value, and conversely. It should further be noted that in this example, when the distance between conductive plate 402 and conductive plate 401a increases, the distance between conductive plate 402 and conductive plate 401b decreases, and conversely.

Capacitor C may further comprise pull-back means (not shown in the drawing), for example, a return spring, arranged to, in the absence of any electric biasing of electrodes g1, g2, s, and d with respect to electrode r, take the mobile assembly back to a so-called idle position, for example, a position where mobile conductive plate 402 is located at an equal distance from fixed conductive plates 401a and 401b (corresponding to the position shown in FIG. 11).

Although this has not been shown in FIG. 11, capacitor C further comprises one or a plurality of stops arranged to avoid for conductive plates 404 and 403, respectively 406 and 405, respectively 402 and 401a, to adhere to each other. As an example, the stops may take the form of:

a first insulating layer coating the upper surface of plate 403 or the lower surface of plate 404;

a second insulating layer coating the upper surface of plate 405 or the lower surface of plate 406; and a third insulating layer coating the upper surface of plate 401a or the lower surface of plate 402.

At the first order, capacitance Cds of capacitor C between its main electrodes s and d is equal to the sum of a capacitance Cds1 formed between conductive plate 401a and conductive plate 402, and of a capacitance Cds2 formed between conductive plate 401b and conductive plate 402, capacitances Cds1 and Cds2 being respectively inversely proportional to distance d1 between plates 401a and 402 and inversely proportional to distance d2 between plates 401b and 402. Thus, capacitance Cds takes a minimum value when conductive plate 402 is at an equal distance from conductive plates 401a and 401b.

When control signals A and B are in the low state, capacitor C is in its idle position, and capacitance Cds of capacitor C has a first value, here corresponding to its minimum value. Output signal S of the cell thus has a first relatively low voltage level Vout1.

When one of input signals A and B is in a high state, mobile conductive plate 404 (if A=1 and B=0) or 406 (if A=0 and B=1) is attracted towards the corresponding fixed conductive plate 403 or 405, by electrostatic interaction. This causes a vertical displacement of the mobile assembly with respect to the fixed assembly, tending to decrease distance d1 between mobile conductive plate 402 and fixed conductive plate 401a. More particularly, mobile conductive plate 402 is pressed against conductive plate 401a, at a distance from conductive plate 401a determined by the stop(s) of the capacitor. Capacitance Cds of capacitor C thus takes a second value greater than the first value. Output signal S of the cell than has a second voltage level Vout2 greater (in absolute value) than the first level.

When the two input signals A and B are in the high state, the vertical displacement of the mobile assembly with respect to the fixed assembly is similar, that is, mobile conductive plate 402 is pressed against conductive plate 401a, at a distance from conductive plate 401a determined by the stop(s) of the capacitor. Capacitance Cds of capacitor C then takes the second value, and output signal S of the cell is at second voltage level Vout2.

Considering that second voltage level Vout2 corresponds to a high logic state of signal S, and that first voltage level Vout1 corresponds to a low logic state of signal S, capacitor C of FIG. 11 effectively carries out an OR function (S=A+B).

It should be noted that in the example of FIG. 11, electrode s comprises two conductive plates 401a and 401b arranged on either side of the conductive plate 402 forming electrode d. This advantageously enables to decrease the influence of voltage Uds between electrodes s and d on the value of capacitance Cds, or even to cancel the influence of voltage Uds on the value of capacitance Cds when conductive plate 402 is at an equal distance from conductive plates 401a and 401b.

As a variation, one of conductive plates 401a and 401b may be omitted. It should be noted that in this example, if conductive plate 401b is omitted and conductive plate 401a is kept, the logic function carried out is an OR function and, if conductive plate 401a is omitted and conductive plate 401b is kept, the logic function carried out is a NOR function.

More generally, it will be within the abilities of those skilled in the art to adapt the structure described in relation with FIG. 11 to implement various basic logic functions (AND, XOR, etc.) by varying the distance between main electrodes d and s of the capacitor according to a combination of the logic input signals applied to the control electrodes.

Figure 12:
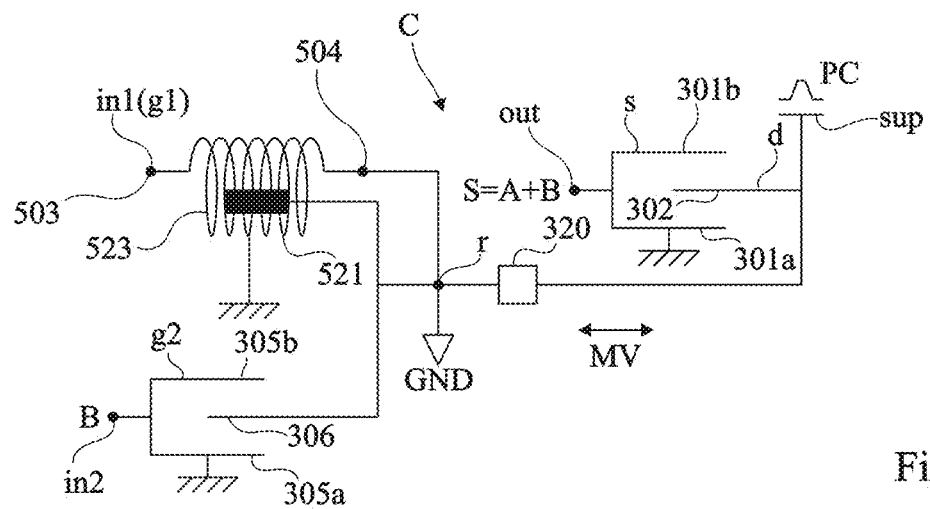
FIG. 12 is a simplified cross-section view of another example of a variable-capacitance capacitor of a capacitive logic cell according to an embodiment.

FIG. 12 is a simplified cross-section view of another embodiment of variable-capacitance capacitor C of the cell of FIG. 2, capable of implementing a logic OR operation.

The capacitor C of FIG. 12 comprises elements common with the capacitor C of FIG. 3. In the following, only the differences between the two structures will be detailed.

The capacitor C of FIG. 12 differs from the capacitor C of FIG. 3 mainly in that it implements an actuation of electromagnetic, also called electrodynamic, type, combined with an actuation of electrostatic type, instead of a purely electrostatic actuation as in the example of FIG. 3.

More particularly, in the example of FIG. 12, conductive plates 303a, 303b, and 304 are replaced with an assembly comprising:

a conductive terminal 503, corresponding to electrode g1 of the capacitor and electrically connected to input node in1 of the cell;

a conductive terminal 504, electrically connected to conductive plate 306;

a conductive coil 521 having a first end electrically connected to terminal 503 and having a second end connected to terminal 504; and a magnet 523 arranged inside of coil 521.

In this example, terminals 503 and 504 and coil 521 belong to the fixed assembly of the capacitor, and magnet 523 is an element of the mobile assembly of the capacitor. In other words, terminals 503 and 504 and coil 521 are fixed with respect to conductive plates 301a, 301b, 305a, and 305b, and magnet 523 is fixed with respect to conductive plates 306 and 302. In this example, the central axis of coil 521 is substantially horizontal.

The application of a control current in coil 521 via electrodes g1 and r causes a displacement of magnet 523 along the central axis of the coil. This results in a variation of the surface area of mobile conductive plate 302 opposite fixed conductive plates 301a and 301b, and thus in a variation of capacitance Cds of capacitor C.

The structure of FIG. 12 has the advantage of enabling to carry out a logic operation having as operands electric signals of different natures, that is, a logic signal A in the form of current and a logic signal B in the form of voltage in the shown example.

As a variation, the structure may be modified to replace the electrostatic actuation mechanism associated with electrode g2 with an electrodynamic actuation mechanism, to form a purely electrodynamic actuation capacitor.

Figure 13:
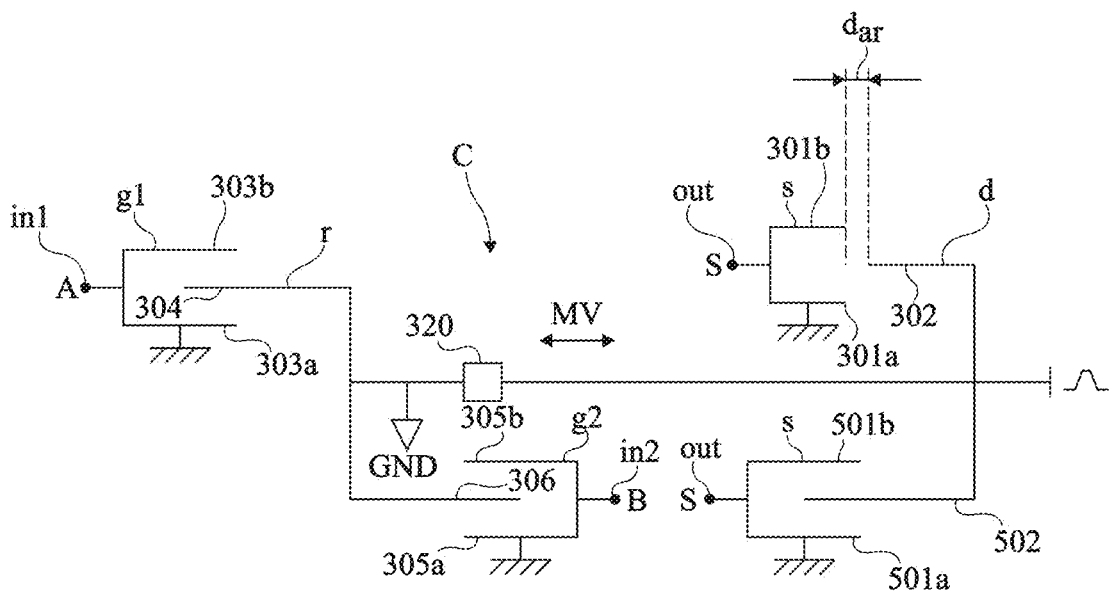
FIG. 13 is a simplified cross-section view of another example of a variable-capacitance capacitor of a capacitive logic cell according to an embodiment.

FIG. 13 is a simplified cross-section view of another embodiment of a variable-capacitance capacitor C, capable of successively implementing two different logic operations with one input and one output, a YES operation (buffer) and a NO operation (inverter), for two different inputs.

The capacitor C of FIG. 13 comprises elements common with the capacitor C of FIG. 4. Only the differences between the two structures will be detailed hereafter.

In the capacitor of FIG. 13, in addition to conductive plates 301a, 301b, 303a, 303b, 305a, 305b, the fixed assembly comprises two additional substantially horizontal conductive plates 501a and 501b opposite each other, electrically connected to output node out of the cell. In this example, electrode s of the capacitor is formed by conductive plates 301a, 301b, 501a, and 501b.

Further, in addition to conductive plates 302, 304, and 306, the mobile assembly of capacitor C of FIG. 13 comprises an additional substantially horizontal conductive plate 502, electrically connected to power supply node sup of the cell. In this example, electrode d of the capacitor is formed by plates 302 and 502.

The fixed assembly and the mobile assembly are arranged so that additional mobile conductive plate 502 is arranged between conductive plates 501a and 501b, at least partially opposite conductive plates 501a and 501b, substantially at an equal distance from conductive plates 501a and 501b.

In capacitor C of FIG. 13, the fixed assembly and the mobile assembly are arranged so that when the surface area of mobile conductive plate 304 opposite fixed conductive plates 303a and 303b increases:

non-overlap distance dar between conductive plate 302 and conductive plates 301a and 301b decreases, or the surface area of conductive plate 302 opposite conductive plates 301a and 301b increases;

the surface area of conductive plate 502 opposite conductive plates 501a and 501b increases; and the surface area of conductive plate 306 opposite conductive plates 305a and 305b decreases, and conversely.

The capacitor C of FIG. 13 is capable of implementing a YES function (S=A) for the signal A applied to input node in1, and a NO function (S=$\overline{B}$) for the signal B applied to input node in2, it being understood that the two functions cannot be simultaneously implemented. In other words, when the YES function is used, signal B should be set to a low state or node in2 should be left floating, and when the NO function is used, signal A should be set to a low state or node in1 should be left floating.

An advantage of the embodiment of FIG. 13 is that it enables, by means of a same logic cell with two inputs and one output, to implement two different logic functions, selectable by the selection of the input having the logic input signal applied thereto.

Figure 14:
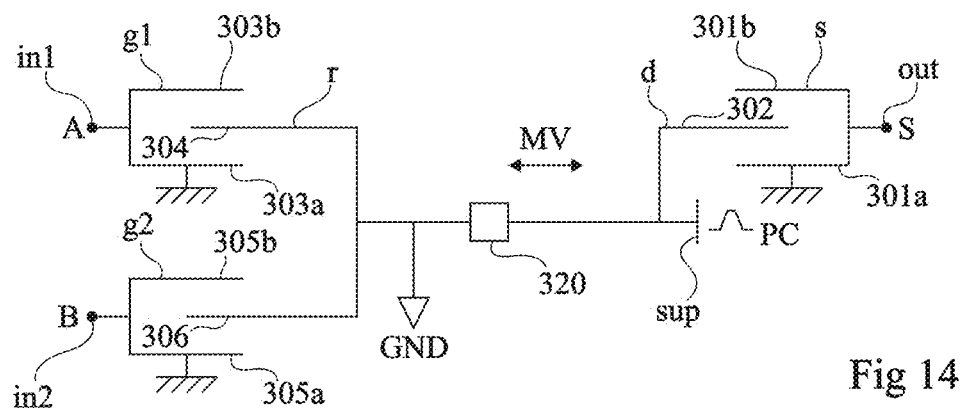
FIG. 14 is a simplified cross-section view of another example of a variable-capacitance capacitor of a capacitive logic cell according to an embodiment.

FIG. 14 is a simplified cross-section view of another embodiment of the variable-capacitance capacitor C of FIG. 2, capable of implementing a logic NOR function.

The capacitor C of FIG. 14 differs from the capacitor C of FIG. 3 essentially in that, in the example of FIG. 14, the fixed assembly and the mobile assembly are arranged so that when the surface area of one of mobile conductive plates 304 and 306 opposite the corresponding fixed conductive plates 303a and 303b, respectively 305a and 305b, increases, the surface area of mobile conductive plate 302 opposite the corresponding fixed conductive plates 301a and 301b decreases, and conversely.

Specific embodiments have been described. Various alterations, modifications, and improvements will occur to those skilled in the art. In particular, it will be within the abilities of those skilled in the art to provide other layouts of the fixed and mobile assemblies of the capacitor than those described hereabove, to carry out the desired logic functions.

It should further be noted that those skilled in the art may combine various elements of the various embodiments and variations described hereabove without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A capacitive logic cell comprising a fixed assembly comprising a first electrode, a mobile assembly comprising a second electrode, and third, fourth, and fifth electrodes, wherein:
   the first, second, third, fourth, and fifth electrodes are electrically insulated from one another;
   the first and second electrodes define a first variable capacitor according to the position of the mobile assembly relative to the fixed assembly;
   the third electrode is connected to a node of application of a first logic input signal of the cell;
   the fourth electrode is connected to a node of application of a second logic input signal of the cell;
   the fifth electrode is connected to a node of application of a first reference potential of the cell; and
   the position of the second electrode relative to the first electrode is a function of a combination of the first and second logic input signals,
   wherein:
   the mobile assembly is mobile in translation with respect to the fixed assembly to vary the surface area of the second electrode opposite the first electrode without varying the distance between the first and second electrodes; or
   the mobile assembly is mobile in translation with respect to the fixed assembly to vary the distance between the first and second electrodes without varying the surface area of the second electrode opposite the first electrode.

2. The cell of claim 1, wherein the first and second logic input signals are referenced to said node of application of a first reference potential.

3. The cell of claim 1, further comprising a sixth electrode electrically insulated from the first, second, third, fourth, and fifth electrodes, the sixth electrode being connected to a node of application of a second reference potential, wherein the first logic input signal is referenced to said node of application of a first reference potential and the second logic input signal is referenced to said node of application of a second reference potential.

4. The cell of claim 1, wherein the second electrode is connected to a node of application of a power supply voltage of the cell, and wherein the first electrode is connected to a node supplying a first logic output signal of the cell.

5. The cell of claim 1, comprising a first electrostatic actuation device capable of causing a displacement of the mobile assembly with respect to the fixed assembly according to the state of the first logic input signal, and a second electrostatic actuation device capable of causing a displacement of the mobile assembly with respect to the fixed assembly according to the state of the second logic input signal.

6. The cell of claim 1, comprising an electrostatic actuation device capable of causing a displacement of the mobile assembly with respect to the fixed assembly according to the state of the first logic input signal, and an electrodynamic actuation device capable of causing a displacement of the mobile assembly with respect to the fixed assembly according to the state of the second logic input signal.

7. The cell of claim 1, wherein the first electrode comprises first and second interconnected conductive portions arranged on either side of the second electrode to limit the influence of the voltage between the first and second electrodes on the position of the mobile assembly relative to the fixed assembly.

8. The cell of claim 3, comprising a seventh electrode connected to a node of application of a third logic input signal of the cell, wherein the position of the second electrode relative to the first electrode is a function of a combination of the first, second, and third logic input signals.

9. The cell of claim 8, wherein the fixed assembly comprises an eighth electrode electrically insulated from the first electrode, the eighth and second electrodes defining a second variable capacitor according to the position of the mobile assembly relative to the fixed assembly.

10. The cell of claim 9, wherein the eighth electrode is connected to a node supplying a second logic output signal of the cell.

* * * * *